Sept. 23, 1969 A. J. NEWLAND 3,469,151
MULTIPLE CHANNEL CUT-OFF MEANS
Filed Oct. 31, 1966
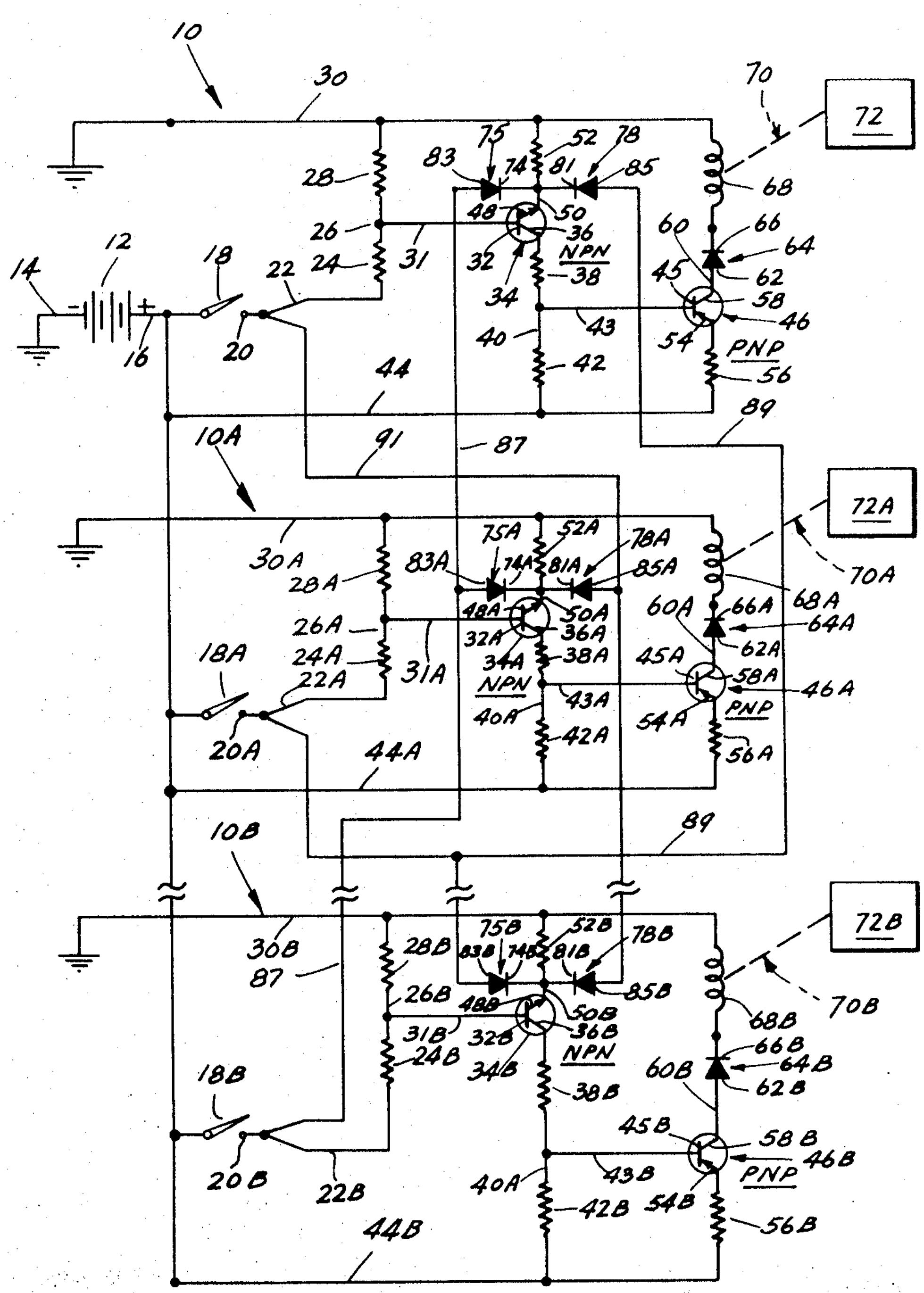
INVENTOR.
ALBERT J. NEWLAND
BY Herbert L. Davis
ATTORNEY United States Patent Office 3,469,151

Patented Sept. 23, 1969

3,469,151

MULTIPLE CHANNEL CUT-OFF MEANS

Albert J. Newland, Glen Rock, N.J., assignor to The Bendix Corporation, Teterboro, N.J., a corporation of Delaware Filed Oct. 31, 1966, Ser. No. 590,667
Int. Cl. H01h 47/02, 47/14
U.S. Cl. 317—136 7 Claims

ABSTRACT OF THE DISCLOSURE

A multiple channel electronic circuit having relays controlled by transistors responsive to input signals and diodes arranged to prevent simultaneous operation of the relays by rendering all channels inoperative while signals appear at the inputs of more than one channel.

Background

Heretofore semiconductors in one channel have been so arranged that an input signal to a control electrode of one transistor may initiate conduction thereof to in turn provide an input signal to the control electrode of another transistor to render the same conductive. Further, there has been filed by the inventor of the subject matter of the present invention a copending U.S. application Ser. No. 582,391, filed Sept. 27, 1966, by Albert J. Newland and assigned to The Bendix Corporation, the assignee of the present invention. The arrangement disclosed in the U.S. application Ser. No. 582,391 provides a means to inhibit conduction in another channel upon an input signal being applied to a first channel and an arrangement in which conduction in any channel operates to prevent conduction in any other channel. Thus in the device disclosed in the copending U.S. application Ser. No. 582,391, in the event pulses appear at separate channels, each pulse appearing at an input of an activated channels will prevent conduction of any other channels. This is done without the complex external switching apparatus such as is shown in U.S. Patent No. 3,152,319, granted Oct. 6, 1964, to Bernard M. Gordon et al. and in U.S. Patent No. 2,867,-723, granted Jan. 6, 1959, to Carl P. Spaulding, and which prior arrangements are responsive not to the presence of a first input signal applied to one channel, but instead to some additional circuit switching means. In distinction, the arrangement of the present invention renders inoperative all other channels upon a single channel being first activated and further provides means to terminate conduction of the channel first activated upon a subsequent pulse appearing at another channel, which other channel is already rendered nonconductive by the single channel.

Summary of the invention

The invention contemplates a multiple channel signal system with first means in each channel to apply a signal pulse, second means to control energization of an actuating means and third means in each channel responsive to the applied signal pulse together with forward control means in each channel responsive to a signal pulse applied in one channel to render the third means of all other of the channels nonresponsive to applied signal pulses.

Another object within the contemplated of the present invention is to provide a novel and simplified electronic channel cut-off means to render nonconductive a channel to which a signal pulse is applied when a signal pulse is applied to any other channel at the same time.

Another object of the invention is to provide an electronic channel cut-off means for preventing simultaneous operation of separate signal channels in which each signal channel includes complementary transistors wherein an input pulse applied to a control electrode of an input signal receiving transistor initiates conduction thereof so as to in turn provide an input signal to a control electrode of another transistor to render the same conductive to provide an output signal to energize an actuator coil to impart motion to mechanical parts of a mechanical control device operated thereby, and which input signal is fed through a diode to another electrode of an input signal receiving transistor in another channel inhibiting conduction thereof so that a channel with an input signal applied to it serves as one controlling channel to prevent conduction of the other channels, said first channel being rendered nonconductive by any input signal applied to any other channel.

It is another object of the invention to provide a simplified electronic cut-off means in which signal pulses may be selectively applied to multiple channels concurrently in an arrangement such as to prohibit an output signal from appearing at any of the channels, and an arrangement operated in response to a closed switch input so that a single channel with an applied signal pulse is conductive only upon all input pulses being removed from other channels.

These and other objects and features of the invention are pointed out in the following description in terms of the embodiment thereof which is shown in the accompanying drawing. It is to be understood, however, that the drawing is for the purpose of illustration only and is not a definition of the limits of the invention, reference being had to the appended claims for this purpose.

Description of the invention

The drawing is a schematic circuit diagram of the control arrangement in which corresponding parts in several signal channels have been indicated by like numerals bearing the suffix A and B to indicate respective parts of the several signal channels.

Referring now to the drawing, there has been indicated by the numerals 10, 10A and 10B separate signal channels which have been reduced in number so as not to confuse the drawing with undue multiplicity of elements. In the drawing, the breaks with respect to signal channel 10B are intended to show that the channels of circuit arrangements in excess of the number illustrated may be introduced within the broken portion by simple extrapolation of the circuits illustrated.

There is shown a suitable of electrical energy or battery 12 having a negative terminal connected to ground by a conductor 14 and a positive terminal connected by a conductor 16 to switch arms 18, 18A and 18B of the respective signal channels 10, 10A and 10B. The switch arm 18 is arranged to be adjustably positioned to close a switch contact 20 connected through a conductor 22 to one end of a resistor 24 which in turn is connected through a conductor 26 to a resistor 28 leading to a grounded conductor 30. The resistors 24 and 28 provide a voltage divider network in which the conductor 26 at the junction thereof is connected through a conductor 31 to a base 32 of an NPN type transistor 34.

The transistor 34 has a collector element 36 connected through a resistor 38, conductor 40 and resistor 42 to a conductor 44 leading to the conductor 16 connected in turn to the positive terminal of the battery 12. The conductor 40 between resistors 38 and 42 is connected by a conductor 43 to a base 45 of a PNP type transistor 46. An emitter element 48 of the transistor 34 is connected through a conductor 50 and a resistor 52 to the grounded conductor 30.

Furthermore, an emitter element 54 of the transistor 46 is connected through a resistor 56 to the conductor 44 leading through conductor 16 to the positive terminal of the battery 12. A collector 58 of transistor 46 is connected through a conductor 60 to an anode element 62 of a diode 64. The diode 64, further has a cathode element 66 connected to one end of an electromagnetic winding 68 having an opposite end connected to the grounded conductor 30. The electromagnetic winding 68 upon energization serves as an actuator effective to drive a suitable mechanical means 70 to operate a mechanical control device 72 which may be a decoder, typewriter, or other like device to be operated thereby.

Further, there are provided cut-off diodes 75 and 78 having cathode elements 74 and 81, respectively, connected to the conductor 50 which in turn leads to emitter element 48 of the NPN type transistor 34, while anode elements 83 and 85 of the diodes 75 and 78 are connected through conductors 87 and 89, respectively, to the switching contacts 20B and 20A so as to render the transistor 34 nonconductive between the collector elements 36 and the emitter element 48 upon either of the switches 18A or 18B of the channels 10A and 10B being closed.

Similarly, the conductor 87 is also connected to an anode element 83A of a cut-off diode 75A having a cathode element 74A connected to a conductor 50A leading to the emitter element 48A of the NPN type transistor 34A to render the same nonconductive upon the switch 18B being closed while the conductor 89 is also connected to an anode element 83B of a cut-off diode 75B having a cathode element 74B connected to a conductor 50B leading to emitter element 48B of the transistor 34B to render the same nonconductive upon the switch 18A being closed.

Further, a conductor 91 leads from switch contact 20 of switch 18 in channel 10 to an anode element 85A of a cut-off diode 78A having a cathode element 81A connected to the conductor 50A leading to emitter element 48A of transistor 34A, while the conductor 91 is also connected to an anode element 85B of a cut-off diode 78B having a cathode element 81B connected to the conductor 50B leading to emitter element 48B of the transistor 34B so that upon the switch 18 of channel 10 being closed, both transistors 34A and 34B will be rendered nonconductive.

In the respective signal channels 10A and 10B the remaining parts indicated by like numerals to those parts heretofore described with reference to the channel 10 and bearing the suffix A and B respectively, operate in a corresponding manner to the complementary parts of the signal channel 10 and therefore a detailed description thereof is not deemed necessary for our full understanding of the invention.

Operation

In the operation of the electronic channel cut-off means of the present invention, it will be seen that since the transistors 34, 34A and 34B are NPN type transistors the same are biased to cut off or nonconducting when no signal pulse appears on the input conductors 22, 22A and 22B, respectively. In this quiescent state no positive voltage appears at the output conductors 60, 60A and 60B leading from the collector elements of the PNP type transistors 46, 46A and 46B, respectively, since the bases 45, 45A and 45B thereof have an effective positive bias applied thereto through the respective resistors 42, 42A and 42B in such quiescent state. Thus in such quiescent state no current will flow through the respective transistors 46, 46A and 46B and the electromagnetic actuator coils 68, 68A and 68B will be maintained in a deenergized condition. In order then to activate one or the other of the coils 68, 68A and 68B, a positive signal pulse is applied at the conductors 22, 22A or 22B, by the selective closing of one or the other of the control switches 18, 18A or 18B.

Thus for example, upon the switch 18 being the first to close a voltage pulse will be applied through the voltage divider formed by the resistors 24 and 28, whereupon a voltage of for example, less than 50% of the supply voltage provided by the source 12 will appear at the base 32 of the NPN type transistor 34. Upon the base 32 becoming thereupon positively biased, such bias applied to the base 32 will be more positive than the emitter element 48 of the NPN type transistor 34 so as to thereupon render the transistor 34 conductive.

The resulting flow of current through the transistor 34 upon the same being thus rendered conductive will cause a less positive voltage to appear at the base 45, of the PNP type transistor 46 than that on the emitter element 54 of the transistor 46. Under such condition, transistor 46 will thereupon conduct causing a positive voltage to appear at the conductor 60. The current flow through transistor 46 thus energizes coil 68. The actuator coil 68 upon such energization is then effective to impart motion to the mechanical device 72. Upon the switch 18 being closed, a positive voltage applied through conductor 91 will appear at the emitters 48A and 48B of the NPN type transistors 34A and 34B, which voltage will be greater than the 50% supply voltage that can be applied to the bases 32A and 32B of transistors 34A and 34B through their respective voltage divider resistorsc 24A and 28A and 24B and 28B so as to prohibit conduction of the respective transistors 34A and 34B. Further, the diode 64 serves to protect the transistor 46 upon the switch 18 being suddenly opened so that the sudden decay of current in the electromagnetic winding 68 resulting in an induced reverse current breakdown voltage in the winding 68 is prevented from effecting or damaging the transistor 46 due to the reverse current blocking action provided by the diode 64 which has the cathode element 66 connected to the electromagnetic winding 68.

Similarly, upon the switches 18A and 18B being selectively closed, a positive voltage is applied respectively through conductors 89 and 87 to prohibit conduction of the NPN type transistors 34 and 34B and the NPN type transistors 34 and 34A, respectively. Thus, it will be seen that the signal channels 10, 10A or 10B which first conducts will prohibit conduction in the other channels.

However, in the interim period, while one channel is conducting, upon the control switch 18, 18A or 18B of the other channels being closed, as stated, there will be no conduction in the subsequentially activated channel. Simultaneously, this subsequentially activated channel will render the first conducting channel inoperative and nonconducting. Similarly, none of the channels will conduct if two or more switches of two or more of the channels are closed. That is, a voltage from an operating channel is fed to all other channels causing them to be inoperative while the operating channel is energized. If a second or third channel is energized while the first channel is still energized, all channels including the first will become inoperative and will remain inoperative as long as more than one channel is energized at any one time.

It should be further noted that if switches 18, 18A and 18B are closed, a condition which prevents conduction in any of the channels, both switches 18B and 18A must be open to render channel 10 conducting to actuate coil 68 and impart motion to mechanical device 72. Similarly, if initially switches 18 and 18A are closed, switch 18A must be open to allow channel 10 to be rendered conductive to energize coil 68 to actuate mechanical device 72. Thus no matter how many channels are connected in this novel arrangement, in order for any channel to conduct the switches of all other channels must be opened. If in the multiple channel arrangement one channel is conducting, since all other switches 18A and 18B are open, no other channel conducts, and if any or all of the other switches 18A and 18B of other channels 10A and 10B are closed, all of the other channels 10, 10A and 10B would be rendered nonconducting.

Thus, simultaneous energization of electromagnetic windings, such as windings 68A and 68B, controlled through separate signal channels 10A and 10B is prevented in the present invention by any other input pulses appearing at another channel, in the case given the channel 10. Similarly, upon an input pulse being applied to either or both channels 10A and 10B, said input pulse will then render channel 10 nonconductive while the channels 10A and 10B will remain nonconductive or inoperative. If the input pulses from all, but one of the channels are removed, the one channel whose input pulse is not removed is then conductive, said input pulse simultaneously biasing all other channels.

Thus, the arrangement can be used in a closed circuit configuration whereby input pulses appear in two or more channels and the channel in which conduction is desired may then be rendered conductive by removing the input pulses applied to all other channels. There is no complex switching mechanism required to effect the desired result.

Thus, the configuration of the present invention has the advantage of providing a simplified electrical network for effectively eliminating simultaneous signal pulses which may be undesirable pulses and prevents the operation of any channel in the system when an input pulse is applied to more than one channel. The undesirable pulses are prohibited from being decoded and simultaneous motion of mechanical parts of mechanical decoders is thereby prevented.

While only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. In a multiple channel signal system of a type having at least three channels and a source of electrical energy, each channel including separately operable first means for selectively applying signal pulses from said source of electrical energy to said channels, and each channel including a corresponding actuating means; wherein the improvement comprises second means, in each channel to control energization of the actuating means in the corresponding channel, third means in each of said signal channels responsive to an initial signal pulse selectively applied by said separately operable first means from said source of electrical energy to render the third means effective to cause the second control means to be operative to energize the actuating means from said source, and forward control means connected to other of said multiple channels and responsive to said initial signal pulse for simultaneously rendering other of said multiple channels nonresponsive to a signal pulse.

2. The improvement defined by claim 1 in which the forward means is simultaneously rendered effective upon the operation of the first means to cause the signal pulse responsive third means in the other of said multiple channels to be thereupon rendered nonresponsive to a subsequently applied signal pulse for the duration of any applied signal pulses to the other channels.

3. In a multiple channel signal system of a type having a source of electrical energy, each channel including a separately operable first means having a switching device for selectively applying signal pulses from said source of electrical energy to the channel and a corresponding actuating means, wherein the improvement comprises; second means in each channel including a current flow control device having a control element, third means in each channel including another current flow control device having a control element responsive to the initial signal pulse to render the last mentioned device conductive of electrical energy the control element of the current flow control device of the second means being responsive to the flow of current through the current flow control device of the third means to in turn render the current flow control device of the second means conductive of flow of electrical enery to effect energization of the actuating means in the corresponding channel, and forward control means including a unidirectional current flow device connected at a point common to the switching device of the first means and the input of the signal channel and effective upon the switching device of the first means being closed to allow the signal pulse to be applied to said channel and simultaneously to bias the current flow control device of the third means in the other of said multiple channels so as to render the last mentioned current flow control device in the other of said channels nonresponsive to a subsequent signal pulse.

4. The improvement defined by claim 3 in which the third means includes a voltage divider means for reducing the value of the signal pulse applied from said source to the control element of the current flow control device of the third means, and the unidirectional current flow control device of the forward control means being effective to apply from the common point of the switching device of the first means and the channel input, a biasing voltage of a greater value to render the current flow control device of the third means of the other of said channels nonresponsive to subsequently applied signal pulses for the duration of the initial signal pulse, the forward control means of any of said other channels upon a signal pulse being applied to any of said other channels being effective to render the current flow control device of the third means of an operative channel nonresponsive to signal pulses.

5. The improvement defined by claim 1 in which the third means includes a first transistor having a base, an emitter element and a collector element, a first resistance network connecting the collector and emitter elements of the first transistor to the source of electrical energy, a first voltage divider network connected across the source of electrical energy by the separately operable first means, means connecting the first voltage divider network to the base of the first transistor to apply the initial signal pulse at a reduced voltage value thereto from said source upon operation of the first means, and the initial signal pulse acting to render the first transistor effective in one sense, and the second means includes a second transistor having a base, an emitter element and a collector element, a resistor and an electromagnetic winding for operating the actuating means, the resistor and winding connecting the respective emitter and collector elements of the second transistor to the source of electrical energy, and the first resistance network including a second voltage divider network, means connecting the second voltage divider network to the base of the second transistor to cause the second transistor to be rendered effective in one sense to cause energization of the electromagnetic winding of the actuating means from the source of electrical energy upon the first transistor being rendered effective in the one sense, and the forward control means including a unidirectional current flow control diode connected between the input of one channel and the emitter element of the first transistor of another of said channels and effective upon an input pulse being applied to the input of one channel to apply a reverse bias to the emitter of the first transistor of the other of said channels to prohibit the last mentioned second transistor of the other of said channels to be rendered effective in the one sense, said reverse biasing voltage having a greater voltage value than the signal pulses applied to the base of said last mentioned first transistor to maintain said last mentioned first transistor effective in another sense and nonresponsive to the subsequent signal pulse.

6. In a channel bias cut-off apparatus of a type including at least three input pulse signal channels, each channel including an approximately equal signal source voltage, separately operable means to selectively connect said signal source voltage to a voltage dividing network and two transistors of opposite types in each channel so arranged that upon one of said transistors being rendered conductive by a signal pulse applied through said network the other transistor is also rendered conductive of electrical energy from said signal source voltage; wherein the improvement comprises forward control means at the input of each of said channels to reversely bias the one transistor in the other of said channels to prevent simultaneous conduction of the other of said channels, and an actuator means energized by the current from the output of the other transistor in said one channel.

7. In a channel cut-off apparatus for transmitting a signal pulse, at least three input channels, a signal source voltage to selectively apply an input signal pulse to each channel, each channel including a voltage dividing network and a pair of transistors of opposite types so arranged that only when one transistor is conductive is the other transistor rendered conductive; wherein the improvement comprises unidirectional voltage forward control means operatively connected to an input of each of said input channels to reverse bias said one transistor of all other channels when an input pulse is applied to the one channel, the unidirectional forward control means being operatively connected at the input of each of said other channels and effective to simultaneously prevent conduction of the one transistor of the one channel upon an input pulse being applied to any of the said other channels.

References Cited

UNITED STATES PATENTS 3,202,967 8/1965 Wolff ------------ 317—138 X

LEE T. HIX, Primary Examiner

U.S. Cl. X.R.

307—115, 232, 255; 317—137, 148.5; 340—147

PO-1050
(5/69)

UNITED STATES PATENT OFFICE
CERTIFICATE OF CORRECTION

Patent No. 3,469,151 Dated September 23, 1969

Inventor(s) Albert J. Newland

It is certified that error appears in the above-identified patent and that said Letters Patent are hereby corrected as shown below:

In claim 1, column 5, line 40 delete the comma (,).

In claim 2, column 5, line 52 insert after the word "forward" the word - - control - - .

In claim 3, column 5, line 69 insert a comma (,) after the word "energy".

In claim 4, column 6, line 18 delete the comma (,).

SIGNED AND SEALED
JUN 9 1970

(SEAL)
Attest:

Edward M. Fletcher, Jr.
Attesting Officer

WILLIAM E. SCHUYLER, JR.
Commissioner of Patents